United States Patent [19]

Crawford

[11] Patent Number: 5,282,227
[45] Date of Patent: Jan. 25, 1994

[54] COMMUNICATION SIGNAL DETECTION AND ACQUISITION

[75] Inventor: James A. Crawford, San Diego, Calif.

[73] Assignee: The Titan Corporation, San Diego, Calif.

[21] Appl. No.: 886,774

[22] Filed: May 21, 1992

[51] Int. Cl.$^5$ .............. H03D 3/24; H04L 27/06
[52] U.S. Cl. .............................. 375/81; 375/95; 375/97; 329/307; 455/258
[58] Field of Search ............. 375/81, 94, 95, 97, 375/111; 455/227, 75, 139, 192.2, 258; 329/325, 306, 307; 331/1 R, 34; 364/728.04, 829, 819

[56] References Cited

U.S. PATENT DOCUMENTS

| 4,943,982 | 7/1990 | O'Neil, II et al. | 375/81 |
| 5,062,123 | 10/1991 | Geile et al. | 375/97 |
| 5,121,414 | 6/1992 | Levine et al. | 375/96 |
| 5,128,626 | 7/1992 | Iwasaki | 375/81 |

OTHER PUBLICATIONS

W. A. Gardener, "Statistical Spectral Analysis A Nonprobalistic Approach", Prentice-Hall, 1988, pp. 497-503.
Saulnier et al., "A VLSI Demodulator for Digital RF Network Applications: Theory and Results," IEEE Journal on Selected Areas in Communications, vol. 8, No. 8, Oct. 1990, pp. 1500-1511.
Natali, "AFC Tracking Algorithms", IEEE Transactions on Communications, vol. Com-32, No. 8, Aug. 1984, pp. 935-947.
Bellini et al., "Digitial Frequency Estimation in Burst Mode QPSK Transmission", IEEE Transactions on Communications, vol. 38, No. 7, Jul. 1990, pp. 959-961.
Sollenberger and Chuang, "Low-Overhead Symbol Timing and Carrier Recovery for TDMA for Portable Radio Systems," IEEE Transactions on Communications, vol. 38, No. 10, Oct. 1990, pp. 1886-1892.

Primary Examiner—Curtis Kuntz
Assistant Examiner—Tesfacdet Bocure
Attorney, Agent, or Firm—Edward W. Callan

[57] ABSTRACT

The presence of a communication signal having a predetermined recognition pattern of symbols that occur at a predetermined rate (1/T) is detected by processing the communication signal to extract in-phase (I) and quadrature-phase (Q) components of the symbols; processing the extracted components to compute a complex autocorrelation function of the extracted components with a time parameter equal to an integer multiple (nT) of the symbol period (T); integrating the complex autocorrelation function over a substantial portion of the recognition pattern; and comparing the magnitude of the integrated complex autocorrelation function with a predetermined threshold value to detect the presence of the recognition pattern. The communication signal is acquired at a given intermediate frequency and at a given phase by adjusting the frequency of a local oscillator signal in response to a frequency error signal provided by processing the real and imaginary components of the integrated complex autocorrelation function and by adjusting the phase of the local oscillator signal in response to a phase error signal provided by processing extracted I and Q components of the communication signal to compute an arctangent of a quotient of a sum of the values of the Q components extracted over an integer multiple (rT) of the symbol period divided by a sum of the values of the I components extracted over the integer multiple (rT) of the symbol period.

15 Claims, 2 Drawing Sheets

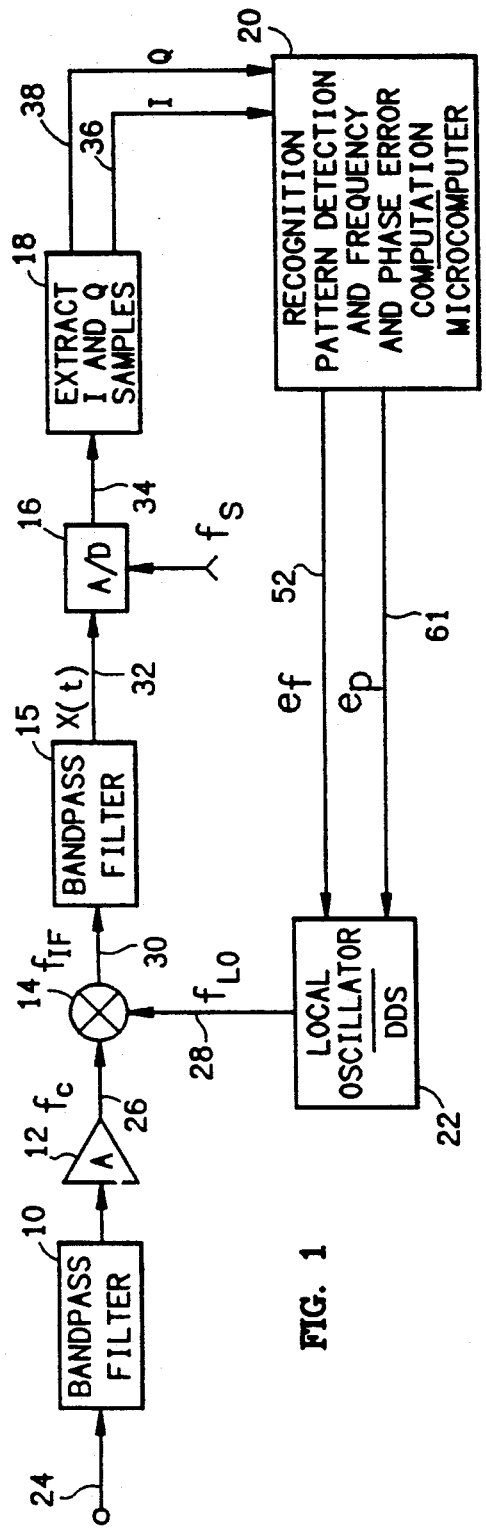
FIG. 1
FIG. 2
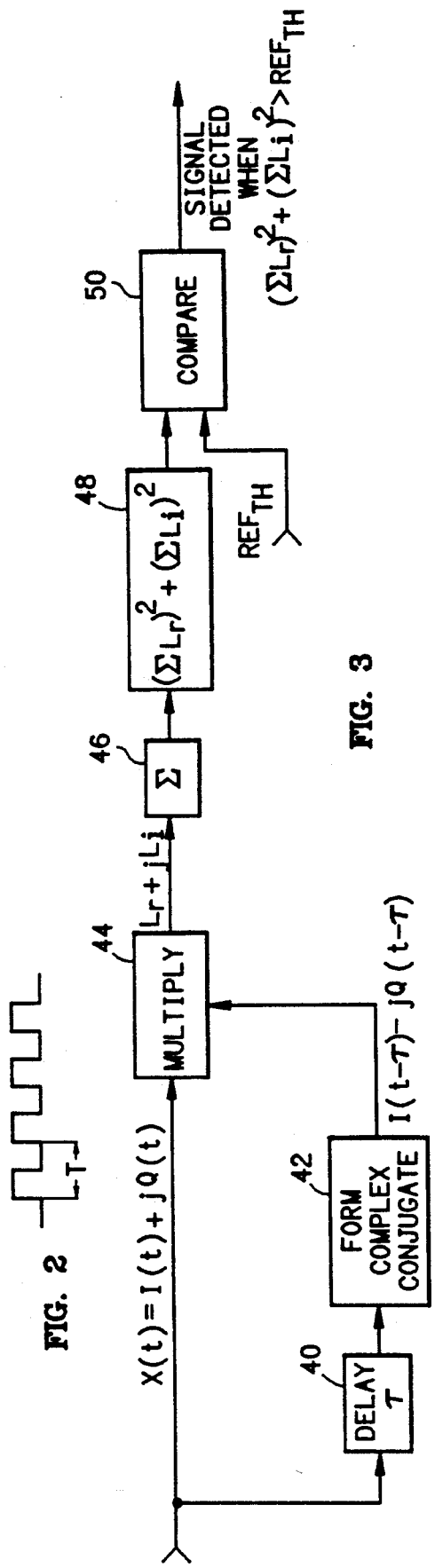
FIG. 3

COMMUNICATION SIGNAL DETECTION AND ACQUISITION

BACKGROUND OF THE INVENTION

The present invention generally pertains to communication signal processing apparatus and is particularly directed to detecting the presence of a predetermined recognition pattern in a communication signal and to acquiring a received communication signal at a given intermediate frequency and at a given phase when the communication signal was modulated onto a carrier signal.

Some communication signals include a predetermined recognition pattern including symbols that occur at a predetermined rate, which recognition pattern may be detected by a communication signal processor to recognize the presence of the communication signal.

In some communication signal processors, the presence of a recognition pattern is detected by processing in-phase (I) and quadrature-phase (Q) components that are extracted from the received communication signal. An example of such processing is described by Saulnier et al., "A VLSI Demodulator for Digital RF Network Applications: Theory and Results," IEEE Journal on Selected Areas in Communications, Vol. 8, No. 8, Oct. 1990, pp. 1500-1511.

Communication signals modulated onto a carrier signal are demodulated upon receipt by mixing the carrier signal with a local oscillator signal to acquire the communication signal at an intermediate frequency, which is further processed to provide the communication signal at a given baseband frequency.

Transmission disturbances, such as high Doppler rate shifts, specular multipath interference and ionosphere anomalies cause the frequency and the phase of a carrier signal to be offset during transmission, whereby the amount of the frequency offset and the amount of the phase offset must be determined and compensated for in order to acquire the received communication signal at the given intermediate frequency and at the given phase.

In some receivers, a mixer mixes the carrier signal with a local oscillator signal provided by a local oscillator at a local oscillator frequency to provide the communication signal at an intermediate frequency, a signal processor processes baseband I and Q components extracted from the communication signal at the intermediate frequency to compute the frequency offset and provides a frequency error signal having a value representative of the computed frequency offset, and the local oscillator responds to the frequency error signal by adjusting the frequency of the local oscillator signal in accordance with the computed frequency offset so that the mixer provides the received communication signal at the given intermediate frequency.

To compensate for the phase offset, the signal processor also processes the extracted I and Q components to compute the phase offset and provides a phase error signal having a value representative of the computed phase offset, and the local oscillator responds to the phase error signal by adjusting the phase of the local oscillator signal in accordance with the computed phase offset so that the mixer provides the communication signal at the given phase.

Various techniques for determining the frequency offset and the phase offset of a received communication signal by processing baseband I and Q components extracted from the received communication signal, are described by Natali, "AFC Tracking Algorithms," IEEE Transactions on Communications, Vol.Com-32, No. 8, Aug. 1984, pp. 935-947; Bellini et al., "Digital Frequency Estimation in Burst Mode QPSK Transmission," IEEE Transactions on Communications, Vol. 38, No. 7, July 1990, pp. 959-961; and Sollenberger and Chuang, "Low-Overhead Symbol Timing and Carrier Recovery for TDMA Portable Radio Systems," IEEE Transactions on Communications, Vol. 38, No. 10, October 1990, pp. 1886-1892.

SUMMARY OF THE INVENTION

The present invention provides a relatively simple apparatus for rapidly detecting the presence of a predetermined recognition pattern in a communication signal and for rapidly acquiring the communication signal at a given intermediate frequency and at a given phase.

In one aspect, the present invention provides an apparatus for detecting the presence of a received communication signal having a predetermined recognition pattern of symbols that are periodically repeated at a predetermined rate (1/T), the apparatus comprising means for processing the communication signal to extract in-phase (I) and quadrature-phase (Q) components of the symbols; means for processing the extracted components to compute a complex autocorrelation function of the extracted components with a time parameter $\tau$ equal to an integer multiple (nT) of the symbol period (T); means for integrating the complex autocorrelation function over a substantial portion of the recognition pattern; and means for comparing the magnitude of the integrated complex autocorrelation function with a predetermined threshold value to detect the presence of the recognition pattern. This technique exploits the fact that under proper constraints, the predetermined recognition pattern is highly correlated and the communication channel noise is essentially uncorrelated.

In another aspect, the present invention provides an apparatus for acquiring a received communication signal at a given intermediate frequency, wherein the communication signal includes a predetermined pattern of symbols that occur at a predetermined rate (1/T), and was modulated onto a carrier signal, the apparatus comprising a local oscillator for providing a local oscillator signal at a local oscillator frequency; means for mixing the local oscillator signal with the carrier signal to provide the communication signal at a nominal intermediate frequency; means for processing the communication signal to extract baseband in-phase (I) and quadrature-phase (Q) components of the symbols; and means for processing the extracted components to compute an offset in the nominal intermediate frequency of the received communication signal with respect to the given intermediate frequency and for providing a frequency error signal having a value representative of the computed frequency offset; wherein the local oscillator is responsive to the frequency error signal for adjusting the frequency of the local oscillator signal in accordance with the computed frequency offset so that the mixing means provides the received communication signal at the given intermediate frequency; wherein the processing means are adapted for processing the extracted I and Q components to compute a complex autocorrelation function of the extracted components with a time parameter equal to an integer multiple (nT) of the symbol period (T); for integrating the complex autocorrelation function; and for computing the frequency offset by processing the real and imaginary components of the integrated complex autocorrelation function.

In a further aspect, the present invention provides apparatus for acquiring a received communication signal at a given intermediate frequency and at a given phase, wherein the communication signal includes a predetermined pattern of symbols that occur at a predetermined rate (1/T), was modulated onto a carrier signal, and has a nonzero average complex value, the apparatus comprising a local oscillator for providing a local oscillator signal at a local oscillator frequency; means for mixing the local oscillator signal with the carrier signal to provide the communication signal at a nominal intermediate frequency; means for computing an offset in the nominal intermediate frequency of the received communication signal with respect to the given intermediate frequency and for providing a frequency error signal having a value representative of the computed frequency offset; wherein the local oscillator is responsive to the frequency error signal for adjusting the frequency of the local oscillator signal in accordance with the computed frequency offset so that the mixing means provides the received communication signal at the given intermediate frequency; means for processing the communication signal to extract baseband in-phase (I) and quadrature-phase (Q) components of the symbols; and means for processing the extracted I and Q components to compute an offset in the phase of the received communication signal with respect to the given phase and to provide a phase error signal having a value representative of said computed phase offset; wherein the local oscillator is responsive to the phase error signal for adjusting the phase of the local oscillator signal in accordance with said computed phase offset so that the mixing means provides the received communication signal at the given phase; and wherein the means for computing the phase offset is adapted for computing the phase offset by computing an arctangent of a quotient of a sum of the values of the Q components extracted over an integer multiple (rT) of the symbol period (T) divided by a sum of the values of the I components extracted over the integer multiple (rT) of the symbol period.

The apparatus of the present invention detects the presence of a predetermined recognition pattern and acquires the communication signal with such rapidity as to accomplish such detection and acquisition during an initial processing of the recognition pattern.

The relative simplicity of the apparatus of the present invention minimizes power requirements for operation and facilitates the use of such apparatus in a portable, battery-powered receiver.

Additional features of the present invention are described in relation to the description of the preferred embodiment.

BRIEF DESCRIPTION OF THE DRAWING

FIG. 1 is a block diagram of the apparatus of the present invention.

FIG. 2 is an example of a recognition pattern in a communication signal detected by the apparatus of FIG. 1.

FIG. 3 is a diagram of a signal detection routine executed by the microcomputer in the apparatus of FIG. 1.

DETAILED DESCRIPTION

Figure 4:
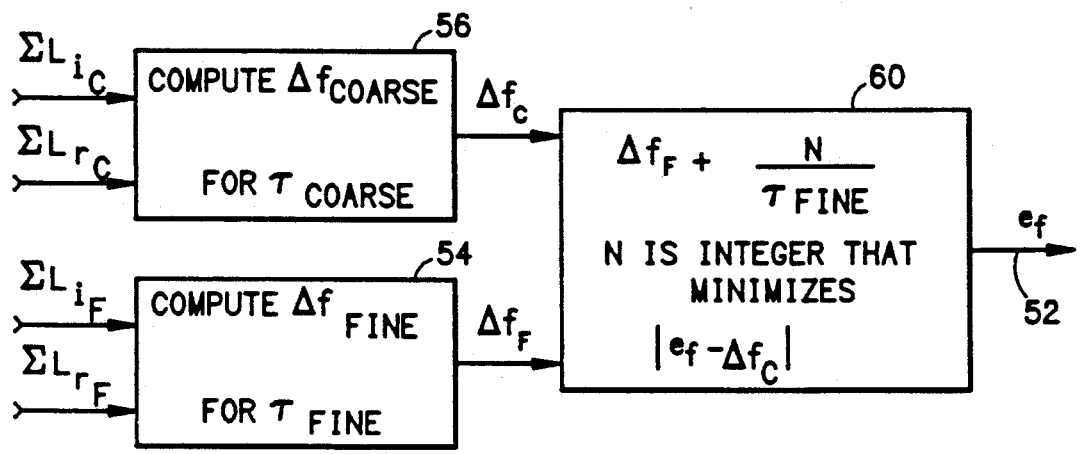
FIG. 4 is a diagram of a frequency offset computation routine executed by the microcomputer in the apparatus of FIG. 1.

Referring to FIG. 1, a preferred embodiment of the apparatus of the present invention includes a first bandpass filter 10, a first amplifier 12, a mixer 14, a second bandpass filter 15, an analog-to-digital (A/D) converter 16, a circuit 18 for extracting I and Q samples, a microcomputer 20 and a local oscillator 22 embodied in a direct digital synthesizer (DDS).

A communication signal that was modulated onto a carrier signal is received at an input terminal 24 with a frequency offset with respect to a given intermediate frequency and with a phase offset with respect to a given phase. The communication signal includes a preamble having a predetermined recognition pattern of symbols that occur at a predetermined rate (1/T), as shown in FIG. 2. The symbol period is T.

The first bandpass filter 10 has a center frequency at a given carrier signal frequency $f_c$.

The received carrier signal is passed from the input terminal 24 through the first bandpass filter 10, amplified by the amplifier 12 and provided on line 26 to the mixer 14. The amplifier 12 hard limits the signal filtered by the first bandpass filter 10 in order to remove signal level variations at the output of the filter 10. This is crucial when strictly fixed-point integer arithmetic is performed in digital signal processing routines performed by the microcomputer 20.

The mixer 14 mixes the received carrier signal with a local oscillator signal at a local oscillator frequency $f_{LO}$ provided on line 28 by the local oscillator 22 to provide the communication signal on line 30 at a nominal intermediate frequency $f_{IF}$.

The second bandpass filter 15 has a center frequency at a desired given intermediate frequency and a broad bandwidth compared to the given baseband frequency of the recognition pattern. An amplifier (not shown) may be provided after the second bandpass filter 15 to hard limit the signals filtered by the second bandpass filter 15 in order to remove signal variations at the output of the filter 15. This is necessary when the passband of the first bandpass filter 10 is not narrow enough to permit adequate hardlimiting by the amplifier 12.

The communication signal is passed through the second bandpass filter 15 onto line 32 and converted by the A/D converter 16 at a sampling rate $f_s$ equal to an even integer multiple s/T of the predetermined rate (1/T) of the recognition pattern symbols to provide a sequence of digital signal samples of the communication signal on line 34. The sampling rate $f_s$ must also satisfy a first order condition for obtaining quadrature samples. $f_s = 4f_{IF}/(2n-1)$ for some integer n. $f_{IF}$ is the center frequency of the second bandpass filter 15.

The circuit 18 extracts I and Q components from the digital signal samples on line 34 in accordance with a Hilbert transform and provides the extracted I and Q components on lines 36 and 38 respectively. The rate at which the extracted I and Q samples are provided on lines 36 and 38 is reduced from the sampling rate by the circuit 18 by performing discrete integrate and dump operations on each sample stream. The rate-reduced samples of the extracted I and Q components are provided at a lesser integer multiple p/T of the predetermined rate (1/T) of the recognition pattern symbols to accommodate processing of the samples by the microcomputer 20 at a slower rate than the sampling rate of the A/D converter 16. The integer p is normally a power of 2.

The microcomputer 20 is programmed by software and/or firmware to detect the presence of the recognition pattern by executing the pattern-detection routine shown in FIG. 3. The communication signal x(t) on line 32 is represented in the microcomputer 20 by sample sequences of baseband in-phase and quadrature-phase components I(t) and Q(t), which in complex notation is $I(t)+jQ(t)$.

The microcomputer 20 computes a complex autocorrelation function of $I(t)+jQ(t)$ by executing a delay subroutine 40 to delay $I(t)+jQ(t)$ by a time parameter $\tau$ equal to an integer multiple nT of the symbol period T, by executing a complex-conjugate-formation subroutine 42 to compute $I(t-\tau)-jQ(t-\tau)$, and executing a multiplication subroutine 44 of multiplying $\{I(t)+jQ(t)\}$ by $\{I(t-\tau)-jQ(t-\tau)\}$ to compute the complex autocorrelation function $L_r+jL_i$.

A fairly large time parameter $\tau$ can be tolerated without substantial amplitude loss. By using a large value for the time parameter $\tau$, the noise components are more uncorrelated, thereby resulting in enhanced recognition pattern detection. The use of a large time parameter $\tau$ also provides discrimination capability against higher symbol-rate signals being simultaneously transmitted over the same communication channel.

The microcomputer 20 executes an integration subroutine 46 to integrate the complex correlation function over a substantial portion, such as seventy percent, of the duration of the predetermined recognition pattern. The microcomputer 20 then executes a subroutine 48 to provide an indication of the magnitude of the integrated complex correlation function by computing $(\Sigma L_r)^2+(\Sigma L_i)^2$. Finally, the microcomputer 20 executes a comparison subroutine 50 of comparing $(\Sigma L_r)^2+(\Sigma L_i)^2$ with a predetermined threshold value $REF_{TH}$ to detect the presence of the recognition pattern in the communication signal when $(\Sigma L_r)^2+(\Sigma L_i)^2$ exceeds $REF_{TH}$.

A problem that can result when using a large value for the time paramenter $\tau$ is that $\Delta\omega\tau$ is much greater than $\pi/4$ for a worst case frequency error $\Delta f$, which leads to nulls in the mean real component $L_r$ of the complex autocorrelation function. Specifically for a 600 sps (symbols per second) recognition pattern, the first null occurs at a frequency offset $e_f$ of $\pm 75$ Hz. and subsequent nulls occur at frequency offsets $e_f$ of $(2n+1)\times 75$ Hz. This problem is dealt with by the microcomputer 20 also executing a parallel comparison subroutine wherein a second predetermined threshold value is compared with $(\Sigma L_i)^2$, since $(\Sigma L_i)^2$ is based upon an average of sine values. The $L_r$ and $L_i$ average values will not be zero simultaneously when a signal is present.

When the presence of the communication signal is detected, the microcomputer 20 further computes the offset in the nominal intermediate frequency of the received communication signal with respect to the given intermediate frequency and provides a frequency error signal $e_f$ having a value representative of the computed frequency offset on line 52 to the local oscillator 22. The local oscillator 22 responds to the frequency error signal $e_f$ by adjusting the frequency $f_{LO}$ of the local oscillator signal on line 28 in accordance with the computed frequency offset $e_f$ so that the mixer 14 provides the received communication signal on line 30 at the given intermediate frequency.

The microcomputer 20 is programmed by software and/or firmware to compute the frequency offset $e_f$ by executing the offset-computation routine shown in FIG. 4. Until the presence of a signal is detected, the microcomputer 20 executes the delay subroutine 40, the complex-conjugate formation subroutine 42 and the multiplication subroutine 44 described above in relation to FIG. 3 to compute a first complex autocorrelation function $L_{rF}+jL_{iF}$ with a fine time parameter $\tau_{FINE}$ and, when there is a large uncertainty as to the amount of the frequency offset, the microcomputer 20 also computes a second complex autocorrelation function $L_{rc}+jL_{ic}$ with a coarse time parameter $\tau_{COARSE}$, wherein $\Sigma_{FINE}$ is a first integer multiple nT of the symbol period T and a second integer multiple $m\tau_{COARSE}$ of the coarse time parameter $\tau_{COARSE}$. The microcomputer 20 further executes the integration subroutine 46 to separately integrate the first and second complex autocorrelation functions.

Referring again to FIG. 4, the microcomputer executes a subroutine 54 of computing a fine estimate $\Delta f_F$ of the frequency offset by using the real and imaginary components $\Sigma L_{rF}$, $\Sigma L_{iF}$ of the integrated first complex autocorrelation function, which is provided as the frequency error signal $e_f$ on line 52 when there is not a large uncertainty as to the amount of the frequency offset. When there is a large uncertainty as to the amount of the frequency offset, the microcomputer also executes a subroutine 56 of computing a coarse estimate $\Delta f_C$ of the frequency offset by using the real and imaginary components $\Sigma L_{rC}$, $\Sigma L_{iC}$ of the integrated second complex autocorrelation function.

Figure 4A:
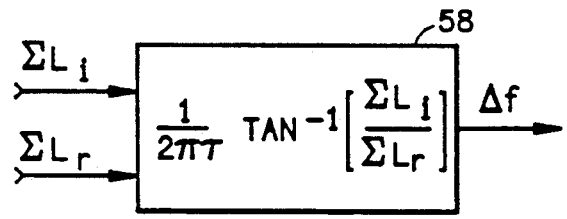
FIG. 4A is a diagram of a frequency offset estimation subroutine executed during the routine of FIG. 4.

To compute the estimates of the coarse and fine estimates $\Delta f_C$, $\Delta f_F$ of the frequency offset, the microcomputer 20 executes a subroutine 58 (shown in FIG. 4A) of computing an arctangent of a quotient of the imaginary component $\Sigma L_i$ of the respective integrated complex autocorrelation function divided by the real component $\Sigma L_r$ of the respective integrated complex autocorrelation function and dividing the arctangent in radians by a product of $2\pi$ times the value of the respective time parameter $\tau_{COARSE}$, $\tau_{FINE}$. This estimate is based on the fact that under usual conditions, the received communication signal is highly correlated, whereas noise is essentially uncorrelated. The accuracy of this estimate is dependent upon bandwidth of the second bandpass filter being broad compared to the given baseband frequency of the recognition pattern.

To resolve any ambiguity in the computed fine and coarse frequency offset estimates for those situations when there is a large uncertainty as the amount of the frequency offset, the microcomputer 20 executes a subroutine 60 of computing the frequency offset that is provided as the value of the error signal $e_f$ on line 52 as the value of a sum of the fine estimate $\Delta f_F$ plus or minus a quotient of an integer N divided by the value of the fine time parameter $\tau_{FINE}$ for the positive or negative value of the integer N that minimizes the absolute value of a difference of the sum $e_f$ minus the coarse estimate $\Delta f_C$.

$e_f = \Delta_F \pm N/\tau_{FINE}$, wherein $N$ is $\pm$ the integer that minimizes $|e_f - \Delta_C|$ The microcomputer 20 processes the extracted I and Q components to compute an offset in the phase of the communication signal with respect to the given phase and provides a phase error signal on line 61 having a value representative of the computed phase offset $e_p$. The local oscillator 22 responds to the phase error signal on line 61 by adjusting the phase of the local oscillator signal on line 28 in accordance with the computed phase offset $e_p$ so that the mixer 14 provides the received communication signal on line 30 at the given phase.

Figure 5:
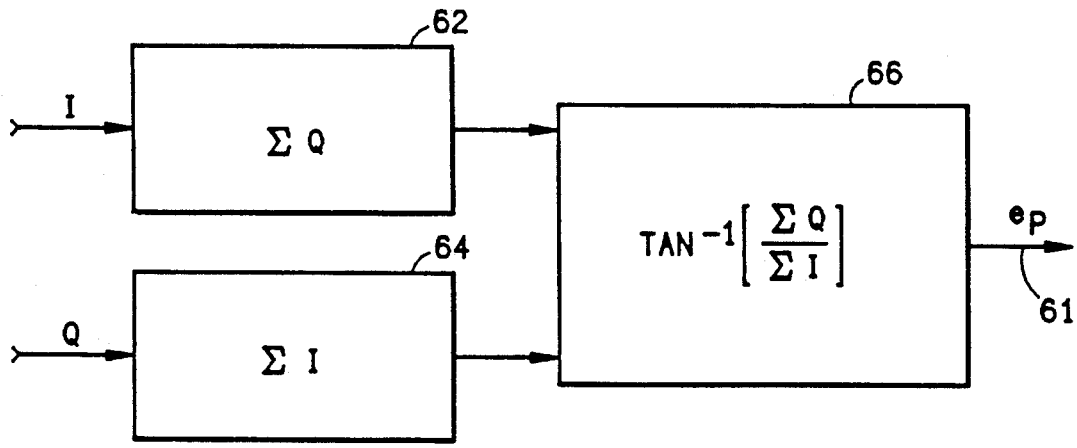
FIG. 5 is a diagram of a phase offset computation routine executed by the microcomputer in the apparatus of FIG. 1.

The microcomputer 20 is programmed by software and/or firmware to compute the phase offset $e_p$ by executing the offset-computation routine shown in FIG. 5.

The microcomputer 20 first executes a subroutine 62 of computing a sum $\Sigma Q$ of the values of the Q components extracted over an integer multiple rT of the symbol period T by integrating the extracted Q components over a duration rT and a subroutine 64 of computing a sum $\Sigma I$ of the values of the I components extracted over the integer multiple rT of the symbol period by integrating the extracted I components over a duration rT.

The microcomputer 20 then executes a subroutine 66 of computing the phase offset $e_p$ by computing an arctangent of a quotient of the sum $\Sigma Q$ of the values of the Q components extracted over the duration nT divided by the sum $\Sigma I$ of the values of the I components extracted over duration nT.

A preferred embodiment of the system of the present invention is designed to detect a predetermined 600 sps trapezoidal offset PSK (TOQPSK) recognition pattern in a communication signal modulated onto a down-converted 10.7 MHz. carrier signal for transmission. The center frequency of the first bandpass filter 10 is 10.7 MHz., the center frequency of the second bandpass filter 15 is 1.152 MHz. and the local oscillator frequency is 12.288 MHz $\pm$ 1 kHz. The allowable frequency offset is not to exceed $\pm 700$ Hz.

The second bandpass filter 15 has a broad bandwidth of 5 kHz. compared to the given 600 Hz. baseband frequency of the recognition pattern.

In executing the signal detection routine of FIG. 3, the time parameter $\tau$ used for computing the complex autocorrelation function is selected to be twice the symbol period T of 1.6666 milliseconds (ms), or n=2 and $\tau$=3.3333 ms. when the recognition pattern is 101010 . . .

The communication signal is converted by the A/D converter 16 at a sampling rate of 1.536 MHz. (s=2560); and the circuit 18 provides the extracted I and Q components on lines 36 and 38 respectively at a rate of 19.2 kHz. (p=32).

In this preferred embodiment, the selected fine time parameter $\tau_{FINE}$ is twice the symbol period T and ten times the coarse time parameter $\tau_{COARSE}$. ($\tau_{FINE}$=3.333 ms. and $\tau_{COARSE}$=0.3333 ms.). This $\tau_{FINE}$ selection results in a maximum non-ambiguous range of $\pm 150$ Hz which is clearly much less than the required frequency offset range of $\pm 700$ Hz min.

Uncertainty as to the amount of the frequency offset $e_f$ is resolved, as described above, by executing the subroutine 60. In an example of such a resolution of the frequency offset, the computed fine estimate of the frequency offset $\Delta_F$ is 65 Hz. and the computed coarse estimate of the frequency offset $\Delta_C$ is $-535$ Hz.

For a value of N=1, $\Delta_F + 1/\tau_{FINE} = 65 + 300 = 365$; and $|e_f - \Delta_C| = |365 + 535| = 900$.

For a value of N=$-1$, $\Delta_F - 1/\tau_{FINE} = 65 - 300 = -235$; and $|e_f - \Delta_C| = |-235 + 535| = 200$.

For a value of N=2, $\Delta_F + 2/\tau_{FINE} = 65 + 600 = 665$; and $|e_f - \Delta_C| = |665 + 535| = 1200$.

For a value of N=$-2$, $\Delta_F + 2/\tau_{FINE} = 65 - 600 = -535$; and $|e_f - \Delta_C| = |-535 + 535| = 0$.

Whereby $e_f = -535$ Hz.

I claim:

1. Apparatus for detecting the presence of a received communication signal having a predetermined recognition pattern of symbols that occur at a predetermined rate (1/T), the apparatus comprising
    means for processing the communication signal to extract in-phase (I) and quadrature-phase (Q) components of the symbols;
    means for processing the extracted components to compute a complex autocorrelation function of the extracted components with a time parameter equal to an integer multiple (nT) of the symbol period (T);
    means for integrating the complex autocorrelation function over a substantial portion of the recognition pattern; and
    means for comparing the magnitude of the integrated complex autocorrelation function; with a predetermined threshold value to detect the presence of the recognition pattern.

2. Apparatus according to claim 1, for also acquiring the received communication signal at a given intermediate frequency, wherein the communication signal was modulated onto a carrier signal, and wherein the extracted I and Q components are baseband I and Q components, the apparatus further comprising
    a local oscillator for providing a local oscillator signal at a local oscillator frequency;
    means for mixing the local oscillator signal with the carrier signal to provide the communication signal at a nominal intermediate frequency;
    means for processing the extracted I and Q components to compute an offset in the nominal intermediate frequency of the received communication signal with respect to the given intermediate frequency and for providing a frequency error signal having a value representative of the computed frequency offset; and
    wherein the local oscillator is responsive to the frequency error signal for adjusting the frequency of the local oscillator signal in accordance with the computed frequency offset so that the mixing means provides the received communication signal at the given intermediate frequency; and
    wherein the computing means is adapted for computing said frequency offset by processing the real and imaginary components of the integrated complex autocorrelation function.

3. Apparatus according to claim 2, further comprising means for sampling the communication signal at an integer multiple (s/T) of the predetermined rate (1/T) to provide communication signal samples that are processed to extract the I and Q components of the symbols;
    wherein the computing means is adapted for computing an estimate of the frequency offset by computing an arctangent of a quotient of the imaginary component of the integrated complex autocorrelation function divided by the real component of the integrated complex autocorrelation function and dividing said arctangent in radians by a product of $2\pi$ times the value of said time parameter.

4. Apparatus according to claim 2, wherein the computing means is adapted for computing and integrating a first said complex autocorrelation function with a fine time parameter ($\tau_{FINE}$) and a second said complex autocorrelation function with a coarse time parameter ($\tau_{COARSE}$), wherein the fine time parameter is a first integer multiple (nT) of the symbol period (T) and a second integer multiple ($m\tau_{COARSE}$) of the coarse time parameter, computing a fine estimate of the frequency offset by using the real and imaginary components of the integrated first said complex autocorrelation function, computing a coarse estimate of the frequency offset by using the real and imaginary components of the integrated second said complex autocorrelation function, and computing a sum of the fine estimate plus or minus a quotient of an integer (N) divided by the value of the fine time parameter for the positive or negative value of the integer (N) that minimizes the absolute values of a difference of said sum minus the coarse estimate to thereby determine the frequency offset.

5. Apparatus according to claim 4, further comprising
means for sampling the communication signal at an integer multiple (s/T) of the predetermined rate (1/T) to provide communication signal samples that are processed to extract the I and Q components of the symbols;
wherein the computing means is adapted for computing the coarse and fine estimates of the frequency offset by computing an arctangent of a quotient of the imaginary component of the respective integrated complex autocorrelation function divided by the real component of the respective integrated complex autocorrelation function and dividing said arctangent in radians by a product of $2\pi$ times the value of the respective time parameter.

6. Apparatus according to claim 2, for also acquiring the received communication cation signal at a given phase, wherein the communication signal has a nonzero average complex value, the apparatus further comprising
means for processing the extracted I and Q components to compute an offset in the phase of the received communication signal with respect to the given phase and to provide a phase error signal having a value representative of said computed phase offset;
wherein the local oscillator is responsive to the phase error signal for adjusting the phase of the local oscillator signal in accordance with said computed phase offset so that the mixing means provides the received communication signal at the given phase; and
wherein the means for computing the phase offset is adapted for computing the phase offset by computing an arctangent of a quotient of a sum of the values of the Q components extracted over an integer multiple (rT) of the symbol period divided by a sum of the values of the I components extracted over the integer multiple (rT) of the symbol period.

7. Apparatus according to claim 6, further comprising
means for sampling the communication signal at an integer multiple (s/T) of the predetermined rate (1/T) to provide communication signal samples that are processed to extract the I and Q components of the symbols;
wherein the computing means is adapted for computing an estimate of the frequency offset by computing an arctangent of a quotient of the imaginary component of the integrated complex autocorrelation function divided by the real component of the integrated complex autocorrelation function and dividing said arctangent in radians by a product of $2\pi$ times the value of said time parameter.

8. Apparatus according to claim 6, wherein the computing means is adapted for computing and integrating a first said complex autocorrelation function with a fine time parameter ($\tau_{FINE}$) and a second said complex autocorrelation function with a coarse time parameter ($\tau_{COARSE}$), wherein the fine time parameter is a first integer multiple (nT) of the symbol period (T) and a second integer multiple ($m\tau_{COARSE}$) of the coarse time parameter, computing a fine estimate of the frequency offset by using the real and imaginary components of the integrated first said complex autocorrelation function, computing a coarse estimate of the frequency offset by using the real and imaginary components of the integrated second said complex autocorrelation function, and computing a sum of the fine estimate plus or minus a quotient of an integer (N) divided by the value of the fine time paramenter for the positive or negative value of the integer (N) that minimizes the absolute values of a difference of said sum minus the coarse estimate to thereby determine the frequency offset.

9. Apparatus according to claim 8, further comprising
means for sampling the communication signal at an integer multiple (s/T) of the predetermined rate (1/T) to provide communication signal samples that are processed to extract the I and Q components of the symbols;
wherein the computing means is adapted for computing the coarse and fine estimates of the frequency offset by computing an arctangent of a quotient of the imaginary component of the respective integrated complex autocorrelation function divided by the real component of the respective integrated complex autocorrelation function and dividing said arctangent in radians by a product of $2\pi$ times the value of the respective time parameter.

10. Apparatus for acquiring a received communication signal at a given intermediate frequency, wherein the communication signal includes a predetermined pattern of symbols that occur at a predetermined rate (1/T), and was modulated onto a carrier signal, the apparatus comprising
a local oscillator for providing a local oscillator signal at a local oscillator frequency;
means for mixing the local oscillator signal with the carrier signal to provide the communication signal at a nominal intermediate frequency;
means for processing the communication signal to extract baseband in-phase (I) and quadrature-phase (Q) components of the symbols; and
means for processing the extracted components to compute an offset in the nominal intermediate frequency of the received communication signal with respect to the given intermediate frequency and for providing a frequency error signal having a value representative of the computed frequency offset;
wherein the local oscillator is responsive to the frequency error signal for adjusting the frequency of the local oscillator signal in accordance with the computed frequency offset so that the mixing means provides the received communication signal at the given intermediate frequency;

wherein the processing means are adapted for processing the extracted I and Q components to compute a complex autocorrelation function of the extracted components with a time parameter equal to an integer multiple (nT) of the symbol period (T); for integrating the complex autocorrelation function; and for computing the frequency offset by processing the real and imaginary components of the integrated complex autocorrelation function.

11. Apparatus according to claim 10, further comprising means for sampling the communication signal at an integer multiple (s/T) of the predetermined rate (1/T) to provide communication signal samples that are processed to extract the I and Q components of the symbols;

wherein the computing means is adapted for computing an estimate of the frequency offset by computing an arctangent of a quotient of the imaginary component of the integrated complex autocorrelation function divided by the real component of the integrated complex autocorrelation function and dividing said arctangent in radians by a product of $2\pi$ times the value of said time parameter.

12. Apparatus according to claim 10, wherein the computing means is adapted for computing and integrating a first said complex autocorrelation function with a fine time parameter ($\tau_{FINE}$) and a second said complex autocorrelation function with a coarse time parameter ($\tau_{COARSE}$), wherein the fine time parameter is a first integer multiple (nT) of the symbol period (T) and a second integer multiple ($m\tau_{COARSE}$) of the coarse time parameter, computing a fine estimate of the frequency offset by using the real and imaginary components of the integrated first said complex autocorrelation function, computing a coarse estimate of the frequency offset by using the real and imaginary components of the integrated second said complex autocorrelation function, and computing a sum of the fine estimate plus or minus a quotient of an integer (N) divided by the value of the fine time paramenter for the positive or negative value of the integer (N) that minimizes the absolute values of a difference of said sum minus the coarse estimate to thereby determine the frequency offset.

13. Apparatus according to claim 12, further comprising means for sampling the communication signal at an integer multiple (s/T) of the predetermined rate (1/T) to provide communication signal samples that are processed to extract the I and Q components of the symbols;

wherein the computing means is adapted for computing the coarse and fine estimates of the frequency offset by computing an arctangent of a quotient of the imaginary component of the respective integrated complex autocorrelation function divided by the real component of the respective integrated complex autocorrelation function and dividing said arctangent in radians by a product of $2\pi$ times the value of the respective time parameter.

14. Apparatus according to claim 10, for also acquiring the received communication signal at a given phase, wherein the communication signal has a nonzero average complex value, the apparatus further comprising means for processing the extracted I and Q components to compute an offset in the phase of the received communication signal with respect to the given phase and to provide a phase error signal having a value representative of said computed phase offset;

wherein the local oscillator is responsive to the phase error signal for adjusting the phase of the local oscillator signal in accordance with said computed phase offset so that the mixing means provides the received communication signal at the given phase; and wherein the means for computing the phase offset is adapted for computing the phase offset by computing an arctangent of a quotient of a sum of the values of the Q components extracted over an integer multiple (rT) of the symbol period divided by a sum of the values of the I components extracted over the integer multiple (rT) of the symbol period.

15. Apparatus for acquiring a received communication signal at a given intermediate frequency and at a given phase, wherein the communication signal includes a predetermined pattern of symbols that occur at a predetermined rate (1/T), was modulated onto a carrier signal, and has a nonzero average complex value, the apparatus comprising a local oscillator for providing a local oscillator signal at a local oscillator frequency;

means for mixing the local oscillator signal with the carrier signal to provide the communication signal at a nomimal intermediate frequency;

means for computing an offset in the nominal intermediate frequency of the received communication signal with respect to the given intermediate frequency and for providing a frequency error signal having a value representative of the computed frequency offset;

wherein the local oscillator is responsive to the frequency error signal for adjusting the frequency of the local oscillator signal in accordance with the computed frequency offset so that the mixing means provides the received communication signal at the given intermediate frequency;

means for processing the communication signal to extract baseband in-phase (I) and quadrature-phase (Q) components of the symbols; and means for processing the extracted I and Q components to compute an offset in the phase of the received communication signal with respect to the given phase and to provide a phase error signal having a value representative of said computed phase offset;

wherein the local oscillator is responsive to the phase error signal for adjusting the phase of the local oscillator signal in accordance with said computed phase offset so that the mixing means provides the received communication signal at the given phase; and wherein the means for computing the phase offset is adapted for computing the phase offset by computing an arctangent of a quotient of a sum of the values of the Q components extracted over an integer multiple (rT) of the symbol period (T) divided by a sum of the values of the I components extracted over the integer multiple (rT) of the symbol period.

* * * * *